(12) United States Patent
Hanada et al.

(10) Patent No.: US 12,191,398 B2
(45) Date of Patent: Jan. 7, 2025

(54) SEMICONDUCTOR DEVICE COMPRISING LIGHTLY DOPED DRAIN (LDD) REGION BETWEEN CHANNEL AND DRAIN REGION

(71) Applicant: Japan Display Inc., Tokyo (JP)

(72) Inventors: Akihiro Hanada, Tokyo (JP); Takuo Kaitoh, Tokyo (JP); Masashi Tsubuku, Tokyo (JP)

(73) Assignee: Japan Display Inc., Tokyo (JP)

( * ) Notice: Subject to any disclaimer, the term of this patent is extended or adjusted under 35 U.S.C. 154(b) by 430 days.

(21) Appl. No.: 17/579,740

(22) Filed: Jan. 20, 2022

(65) Prior Publication Data

US 2022/0149203 A1 May 12, 2022

Related U.S. Application Data

(63) Continuation of application No. PCT/JP2020/029286, filed on Jul. 30, 2020.

(30) Foreign Application Priority Data

Aug. 30, 2019 (JP) .................................. 2019-158096

(51) Int. Cl.
*H01L 29/78* (2006.01)
*H01L 29/786* (2006.01)

(52) U.S. Cl.
CPC .... *H01L 29/7869* (2013.01); *H01L 29/78618* (2013.01); *H01L 29/78645* (2013.01); *H01L 29/78696* (2013.01)

(58) Field of Classification Search
CPC .......... H01L 29/7869; H01L 29/78618; H01L 29/78645; H01L 29/78696

(Continued)

(56) References Cited

U.S. PATENT DOCUMENTS

2004/0124469 A1* 7/2004 Makita .............. H01L 29/42384
257/E27.111
2005/0199960 A1* 9/2005 Hoffman ............. H01L 29/7869
257/368

(Continued)

FOREIGN PATENT DOCUMENTS

JP 2017-076785 A 4/2017
JP 2017-135408 A 8/2017

(Continued)

OTHER PUBLICATIONS

International Search Report issued Oct. 27, 2020 in PCT/JP2020/029286 filed on Jul. 30, 2020, 2 pages.

(Continued)

*Primary Examiner* — Didarul A Mazumder
(74) *Attorney, Agent, or Firm* — Maier & Maier, PLLC

(57) ABSTRACT

The purpose of the present invention is to suppress a variation in a threshold voltage (Δ Vth) in a Thin Film Transistor (TFT) using an oxide semiconductor. The present invention takes a structure as follows to attain this purpose. A semiconductor device having TFT using an oxide semiconductor including: a channel region, a source region, a drain region, and a transition region between the channel region and the source region and between the channel region and the drain region, in which a resistivity of the transition region is smaller than that of the channel region, and larger than that of the source region or the drain region; a source electrode is formed overlapping the source region, and a drain electrode is formed overlapping the drain region; and a thickness of the transition region of the oxide semiconductor is larger than a thickness of the channel region of the oxide semiconductor.

15 Claims, 13 Drawing Sheets

(58) Field of Classification Search
USPC .......................................... 257/288; 438/197
See application file for complete search history.

(56) References Cited

U.S. PATENT DOCUMENTS

| | | | |
|---|---|---|---|
| 2011/0042670 A1* | 2/2011 | Sato | H01L 29/78621 257/E29.296 |
| 2012/0049276 A1* | 3/2012 | Shingu | H01L 29/458 257/330 |
| 2012/0228605 A1* | 9/2012 | Noda | H01L 29/78696 257/E29.094 |
| 2013/0240875 A1* | 9/2013 | Endo | H01L 29/66969 257/43 |
| 2015/0021594 A1* | 1/2015 | Yamada | H01L 27/14658 257/66 |
| 2015/0060844 A1* | 3/2015 | Miyairi | H01L 29/41791 257/43 |
| 2017/0104018 A1* | 4/2017 | Yamazaki | H01L 27/1225 |

FOREIGN PATENT DOCUMENTS

| | | |
|---|---|---|
| WO | 2015186602 A1 | 12/2015 |
| WO | 2019025917 A1 | 2/2019 |

OTHER PUBLICATIONS

Office Action issued on Sep. 13, 2022, in corresponding Japanese Application No. 2019-158096 (11 pages Including English translation).

* cited by examiner

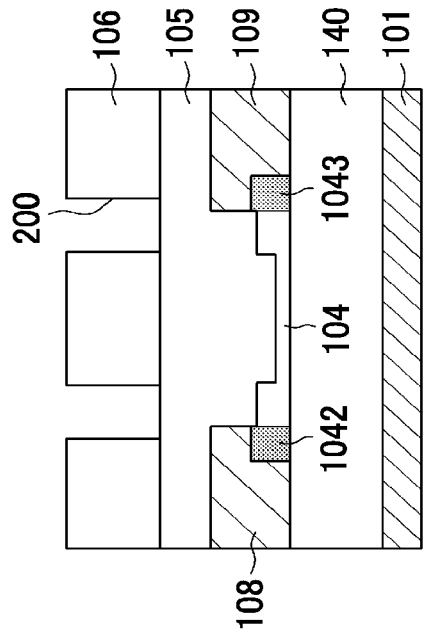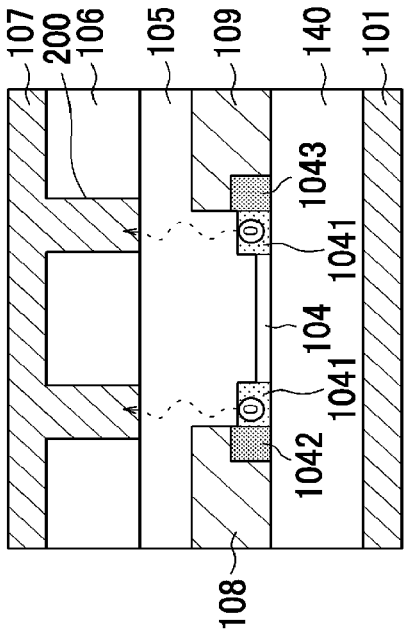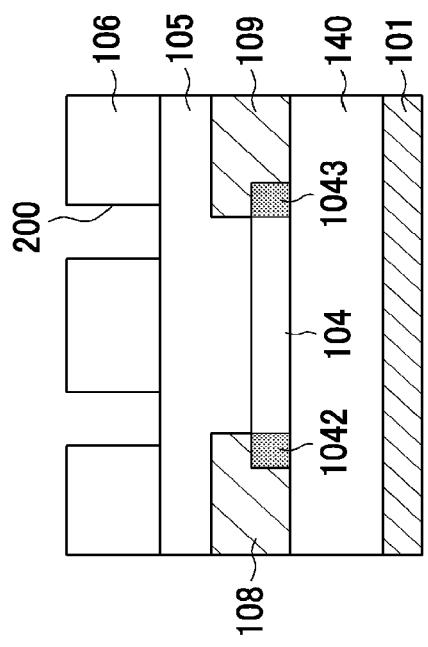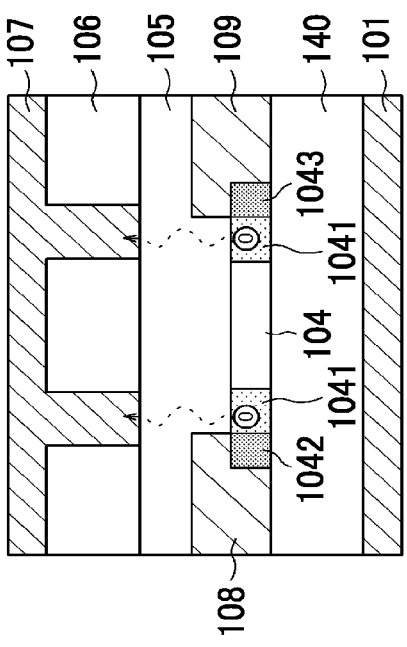

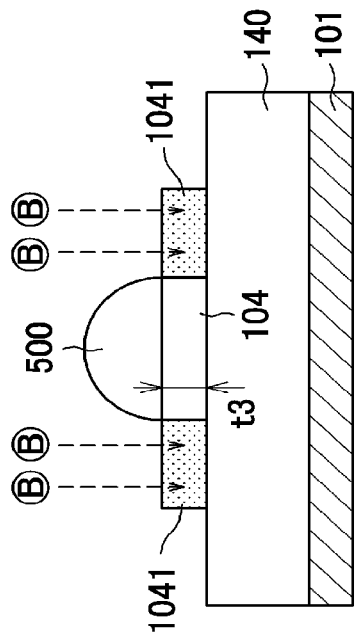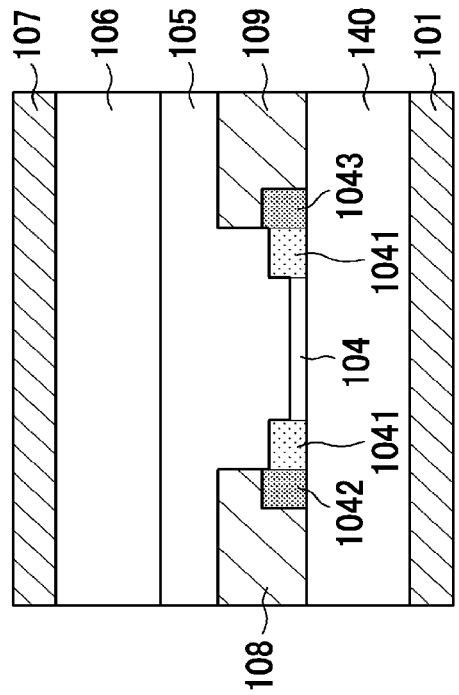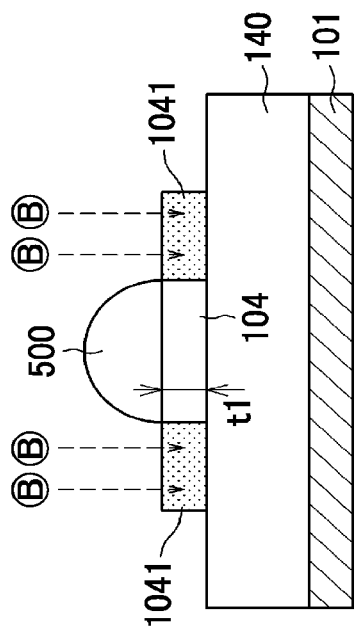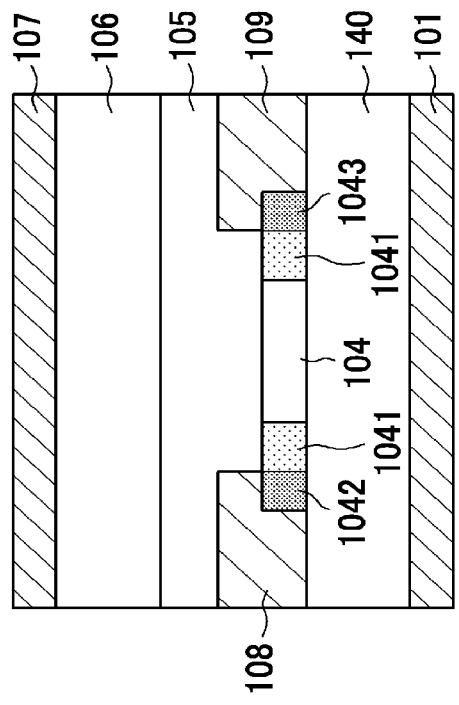

SEMICONDUCTOR DEVICE COMPRISING LIGHTLY DOPED DRAIN (LDD) REGION BETWEEN CHANNEL AND DRAIN REGION

The present application is a continuation application of International Application No. PCT/JP2020/029286, filed on Jul. 30, 2020, which claims priority to Japanese Patent Application No. 2019-158096, filed on Aug. 30, 2019. The contents of these applications are incorporated herein by reference in their entirety.

BACKGROUND OF THE INVENTION

(1) Field of the Invention

The present invention relates to a semiconductor device having a TFT capable of reducing variation in threshold voltage (Vth).

(2) Description of the Related Art

Although a thin film transistor (TFT, Thin Film Transistor) is widely used in a liquid crystal display device, an organic EL display device or an organic EL display device, it can be used in a micro LED display device, an electronic paper or the like. It is also possible to use it as a switching element such as a sensor. TFTs used in semiconductor devices including some image display devices and sensors often operate at higher driving voltages than conventional TFTs.

In a TFT, a high electric field is generated between a channel region and a drain region, and hot carriers are generated in this portion. Due to the influence of hot carriers, there arises a problem that the threshold voltage (Vth) of the TFT fluctuates. This phenomenon can be mitigated by forming an LDD (Lightly Doped Drain) region in which an electric resistance transitions between a channel region and a drain region.

Patent Document 1 describes a configuration in which, in a top-gate TFT, a source region and a drain region are formed by plasma processing an oxide semiconductor, and an LDD region is formed by making a SiN film into contact with the semiconductor. Patent Document 2 describes that a top gate oxide semiconductor TFT is composed of a first oxide semiconductor constituting a channel region and a second oxide semiconductor constituting a source and a drain region; the second semiconductor has a relatively high resistance at portion contacting the channel region of the first oxide semiconductor and has relatively low resistance at another portion, thus, parasitic capacitance with the gate electrode is reduced. Further, the patent document 2 describes a portion having a relatively large resistance in the second semiconductor is operated as an LDD region.

Patent Document

Patent document 1: Japanese patent application laid open No. 2017-76785 A
Patent document 2: Japanese patent application laid open No. 2017-135408 A

SUMMARY OF THE INVENTION

In a TFT using polysilicon, an LDD region is formed in order to cope with a problem of hot carriers generated between a channel and a drain. On the other hand, in a TFT using an oxide semiconductor which has a wide band gap, impact ionization and avalanche breakdown hardly occur, and a problem of hot carriers hardly occurs.

However, when the driving voltage of the TFT increases, a problem of hot carriers also arises in an oxide semiconductor. For example, in some semiconductor devices, the gate voltage of the TFT may be set to about 38 V. In such a high voltage operation, variation of Vth due to hot carrier deterioration becomes remarkable.

It is an object of the present invention to provide a TFT using an oxide semiconductor, which suppresses variation in Vth.

The present invention overcomes the above problems; a concrete means is as follows.

(1) A semiconductor device having TFT using an oxide semiconductor including: the oxide semiconductor including a channel region, a source region, a drain region, and a transition region between the channel region and the source region and between the channel region and the drain region, in which a resistivity of the transition region is smaller than that of the channel region, and larger than that of the source region or the drain region; a source electrode is formed overlapping the source region, and a drain electrode is formed overlapping the drain region; and a thickness of the transition region of the oxide semiconductor is larger than a thickness of the channel region of the oxide semiconductor.

(2) A semiconductor device having TFT using an oxide semiconductor including: the oxide semiconductor including a channel region, a source region, a drain region, and a transition region between the channel region and the source region and between the channel region and the drain region, in which a resistivity of the transition region is smaller than that of the channel region, and larger than that of the source region or the drain region; a source electrode is formed overlapping the source region, and a drain electrode is formed overlapping the drain region; a first gate insulating film is formed covering the oxide semiconductor; a second gate insulating film is formed covering the first gate insulating film; a through hole is formed in the second gate insulating film at a place corresponding the transition region of the oxide semiconductor; and a gate electrode is formed covering the second insulating film and the through hole.

(3) A semiconductor device having TFT using an oxide semiconductor including: the oxide semiconductor including a channel region, a source region, a drain region, and a transition region between the channel region and the source region and between the channel region and the drain region, in which a resistivity of the transition region is smaller than that of the channel region, and larger than that of the source region or the drain region; a source electrode is formed overlapping the source region, and a drain electrode is formed overlapping the drain region; a thickness of a central portion of the channel region is 60 nm or less; and ions are doped in the transition region to raise a conductivity.

BRIEF DESCRIPTION OF THE DRAWINGS

FIG. 14A is a cross sectional view of a first manufacturing step in a first example according to second embodiment;

FIG. 14B is a cross sectional view of a second manufacturing step in a first example according to second embodiment;

FIG. 15A is a cross sectional view of a first manufacturing step in a second example according to second embodiment;

FIG. 15B is a cross sectional view of a second manufacturing step in a second example according to second embodiment;

FIG. 16A is a cross sectional view of a first manufacturing step in a first example according to third embodiment;

FIG. 16B is a cross sectional view of a second manufacturing step in a first example according to third embodiment;

FIG. 17A is a cross sectional view of a first manufacturing step in a second example according to third embodiment; and FIG. 17B is a cross sectional view of a second manufacturing step in a second example according to third embodiment.

DETAILED DESCRIPTION OF THE PREFERRED EMBODIMENTS

The present invention is explained by the following embodiments in detail.

Embodiment 1

Figure 1:
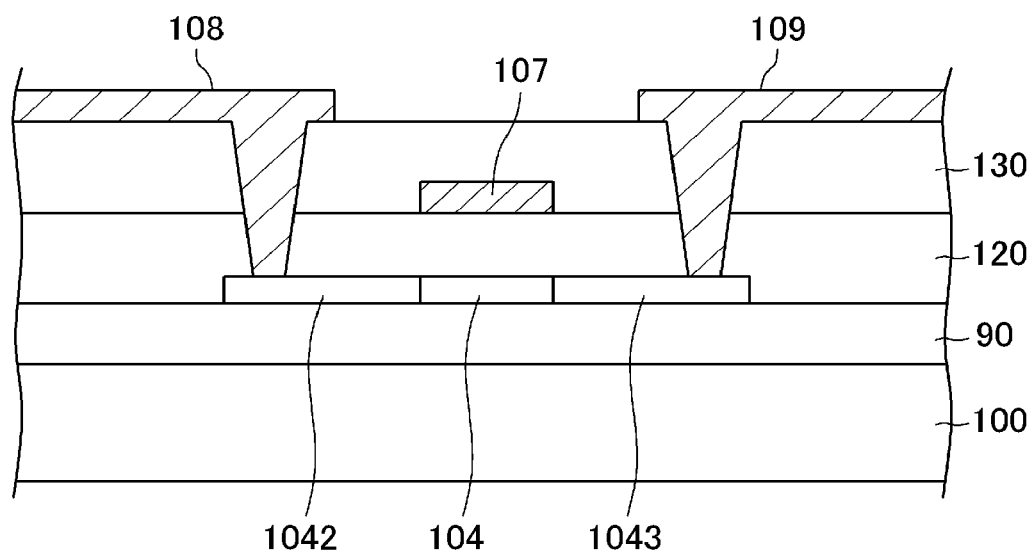
FIG. 1 is cross sectional view of an oxide semiconductor TFT.

FIG. 1 is a cross-sectional view of a conventional TFT using an oxide semiconductor. Hereinafter, an oxide semiconductor is sometimes referred to as an OS (Oxide Semiconductor). Although FIG. 1 shows a top-gate TFT, the following description is also applied to a bottom-gate TFT. In FIG. 1, a base film 90 is formed on a TFT substrate 100 formed of glass, and an oxide semiconductor 104 is formed thereon. A silicon oxide film (hereinafter referred to as a SiO film) capable of supplying oxygen is used as the base film 90.

In an oxide semiconductor, a source region 1042 is formed at one side of a channel region 104 and a drain region 1043 is formed at another side of a channel region 104. The source region 1042 and the drain region 1043 are formed, for example, by performing plasma treatment on the oxide semiconductor or by ion implantation to the oxide semiconductor.

A gate insulating film 120 is formed over the oxide semiconductor 104. The gate insulating film 120 is formed of a SiO film. This is for supplying oxygen to the oxide semiconductor 104. A gate electrode 107 is formed on the gate insulating film 120. An interlayer insulating film 130 is formed covering the gate electrode 107. Through holes are formed in the gate insulating film 120 and the interlayer insulating film 130, and connection between the drain region 1043 and the drain electrode 109 or connection between the source region 1042 and the source electrode 108 is enabled.

In a TFT using an n-type channel, a portion of high electric field is generated in the channel region 104 near the boundary portion between the channel region 104 and the drain region 1043, and hot carriers are generated in this portion. During operation of the TFT, hot carriers are accumulated in the gate insulating film 120. Then, the threshold voltage Vth of the TFT fluctuates.

Figure 2:
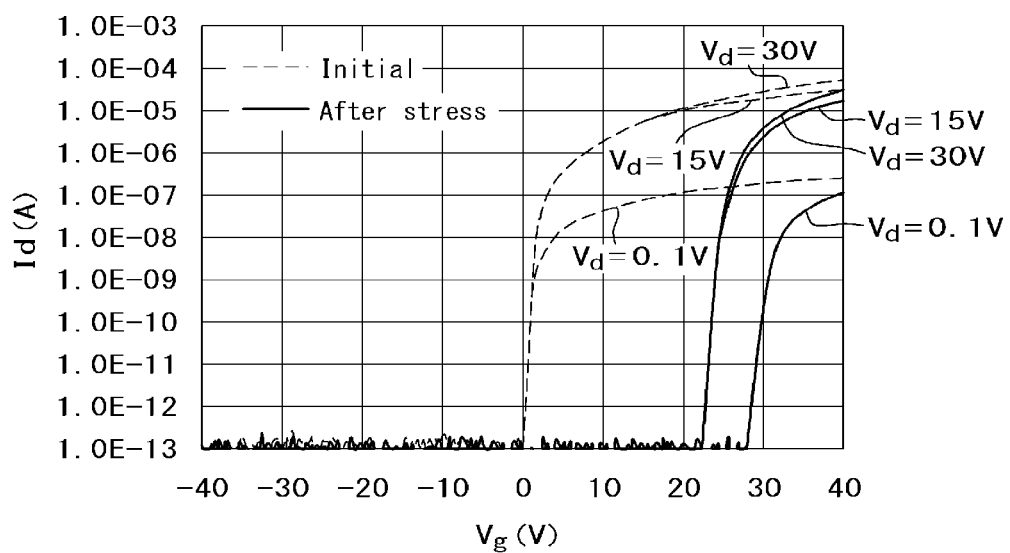
FIG. 2 is a graph showing deviation of Δ Vth.

FIG. 2 is a graph showing variation in threshold voltage Vth of a TFT including an oxide semiconductor. In FIG. 2, a horizontal axis represents a gate voltage (Vg), and a vertical axis represents a drain current (A). A vertical axis represents a log scale. The drain current also varies with the drain voltage Vd. In FIG. 2, a case in which the drain voltage Vd is 0.1 V, a case in which the drain voltage Vd is 15 V and a case in which the drain voltage Vd is 30 V will be described. In FIG. 2, a dotted line indicates an initial characteristic of the threshold voltage Vth, and a solid line indicates a characteristic after the operation of the TFT.

The dotted line in FIG. 2 indicates that initially the threshold voltage Vth is 0 V. A solid line in FIG. 2 shows that, when the gate voltage Vg is operated at 38 V, the deviation of the threshold voltage Vth is 28 V when Vd is 0.1 V, and is 22 V when Vd is 15 V or 30 V. Generally, the oxide semiconductor is less likely to suffer from hot carrier degradation than polysilicon TFTs, and the threshold voltage Vth is less likely to change, but when operating at a high voltage, as shown in FIG. 2, a very large variation occurs.

Figure 3:
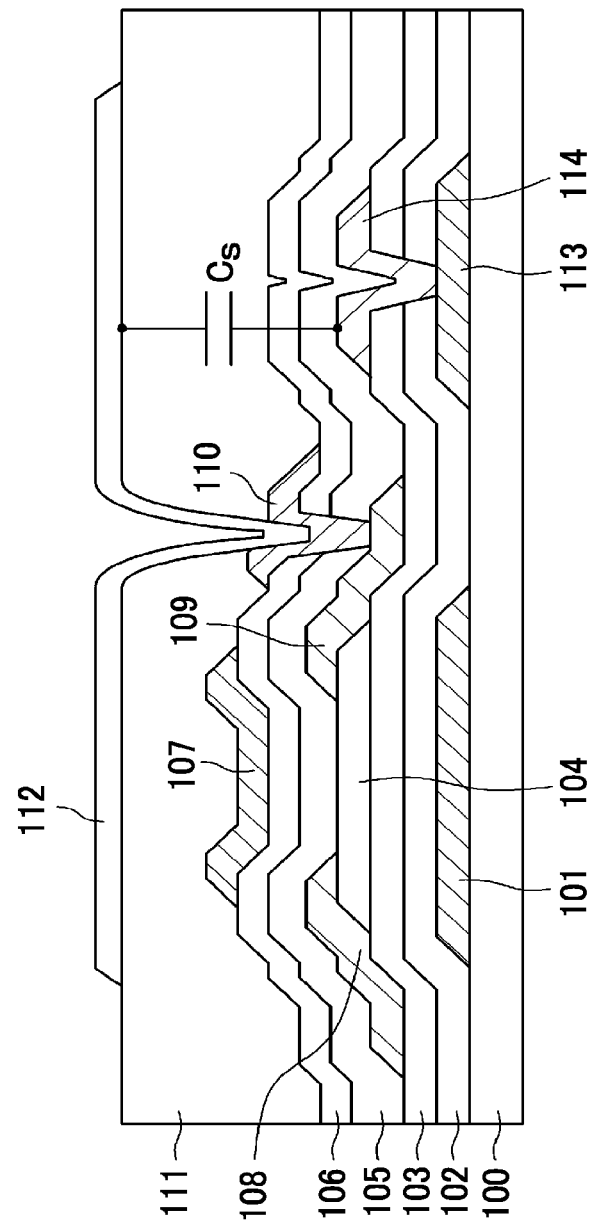
FIG. 3 is a cross-sectional view showing a partial layer structure of a semiconductor device using an oxide semiconductor TFT.
Figure 4:
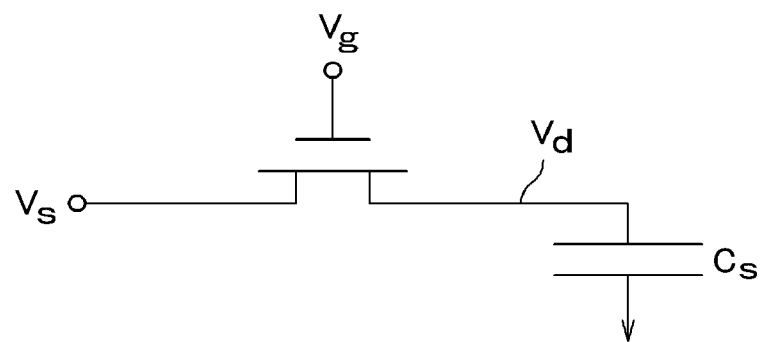
FIG. 4 is an equivalent circuit of a semiconductor device using an oxide semiconductor TFT as a switching element.

Although the present invention addresses the variation of threshold voltage Vth by forming an LDD between the channel and the drain, it is particularly characterized by the configuration of LDD. FIG. 3 is a cross-sectional view showing a TFT using an oxide semiconductor and a layer structure in the vicinity of the TFT in a semiconductor device. The equivalent circuit shown in FIG. 3 is, for example, as shown in FIG. 4. In FIG. 4, the TFT operates as a switching element for storing charge corresponding to a signal in the storage capacitor Cs. For example, in an image device, the storage capacitor Cs corresponds to a pixel capacitance.

In FIG. 3, a left-side configuration is a TFT, and a right-side configuration is a storage capacitor Cs. The TFT is a dual-gate TFT in which a gate electrode is provided on the lower side and the upper side of an oxide semiconductor 104. On the left side of FIG. 3, a gate electrode 101 is formed on a glass substrate 100, and a first lower gate insulating film 102 is formed of silicon nitride (hereinafter, referred to as SiN) covering the gate electrode 101 and a second lower gate insulating film 103 is formed of SiO covering the first lower gate insulating film 102. An oxide semiconductor 104 is formed over the second lower gate insulating film 103.

A source electrode 108 which is a metal is stacked on one side of the oxide semiconductors 104, and a drain electrode 109 that is a metal is stacked on another side of the oxide semiconductors 104. A first upper gate insulating film 105 is formed of SiO covering the oxide semiconductor 104, the source electrode 108, and the drain electrode 109; a second upper gate insulating film 106 is formed of SiN covering the first upper gate insulating film 105. In the layer in contact with the oxide semiconductor 104, both the upper layer 105 and the lower layer 103 are formed of SiO. This is for enabling oxygen to be supplied from SiO to the oxide semiconductor 104. An upper gate electrode 107 is formed on the second upper gate insulating film 106.

A planarizing film 111 is formed of an organic film, for example, covering the upper gate electrode 107 and the second upper gate insulating film 106. A capacitor electrode 112 constituting one of the electrodes of the storage capacitor is formed on the planarization film 111. In the case of a display device, this becomes, for example, a pixel electrode made of ITO (Indium Tin Oxide).

In FIG. 3, through holes are formed in the first upper gate insulating film 105 and the second upper gate insulating film 106, and the relay electrode 110 and the drain electrode 109 are connected. Further, through holes are formed in the planarization film 111, and the capacitor electrode 112 and the relay electrode 110 are connected to each other. Note that the capacitor electrode 112 extends on the right side of the planarizing film 111 in FIG. 3, and forms a storage capacitor Cs between itself and the common electrode 114.

On the right side of FIG. 3, a common wiring 113 extends on the substrate 100, and is connected to the common electrode 114 formed on the second lower gate insulating film 103 via the through holes formed in the first lower gate insulating film 102 and the second lower gate insulating film 103. A storage capacitor Cs is formed between the common electrode 114 and the capacitor electrode 112. Since the storage capacitor Cs in FIG. 3 is formed with a thick planarizing film 111 interposed therebetween, it does not have a large capacity, but when a large capacitance is required, the storage capacitor Cs can be formed with another insulating film.

Figure 5:
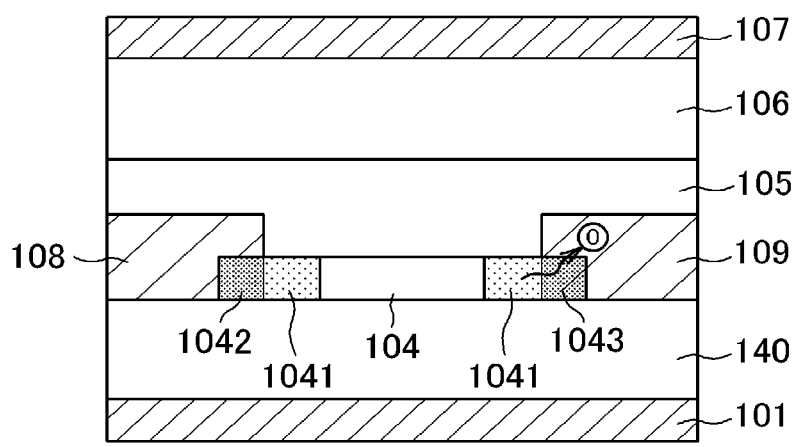
FIG. 5 is a detailed cross-sectional view of a dual-gate TFT including an oxide semiconductor.

FIG. 5 is an enlarged sectional view of the vicinity of the TFT. In FIG. 5, the lower gate insulating film 140 is simply described as a one layer SiO film. In FIG. 5, the TFT of the oxide semiconductor 104 has a dual gate structure in which a lower gate electrode 101 is provided on a lower side and an upper gate electrode 107 is provided on an upper side. In the oxide semiconductor 104, a source electrode 108 formed of a metal is stacked on the left side, and a drain electrode 109 formed of a metal is stacked on the right side.

In the oxide semiconductor 104 of FIG. 5, a white portion in a central portion is a channel region 104, a portion with thin dots is an LDD region 1401, and a portion with dark dots is a source region 1042 or a drain region 1043. The oxide semiconductor of the portion where the metal is laminated is made conductive because oxygen is taken into the metal, and the source region 1042 or the drain region 1043 is formed. Further, oxygen diffuses from the oxide semiconductor in the vicinity of the source region 1042 or the drain region 1043 into the drain region 1043 or the source region 1042, consequently, oxygen in this portion is less than in the channel portion. Therefore, the resistance of the oxide semiconductor in this portion is smaller than that of the channel and larger than that of the source region 1042 or the drain region 1043. Thus, this region can act as an LDD 1041. However, merely stacking the drain electrode 109 and the source electrode 108 on the oxide semiconductor 104 does not serve as a countermeasure against the change Δ Vth of the threshold voltage.

Figure 6:
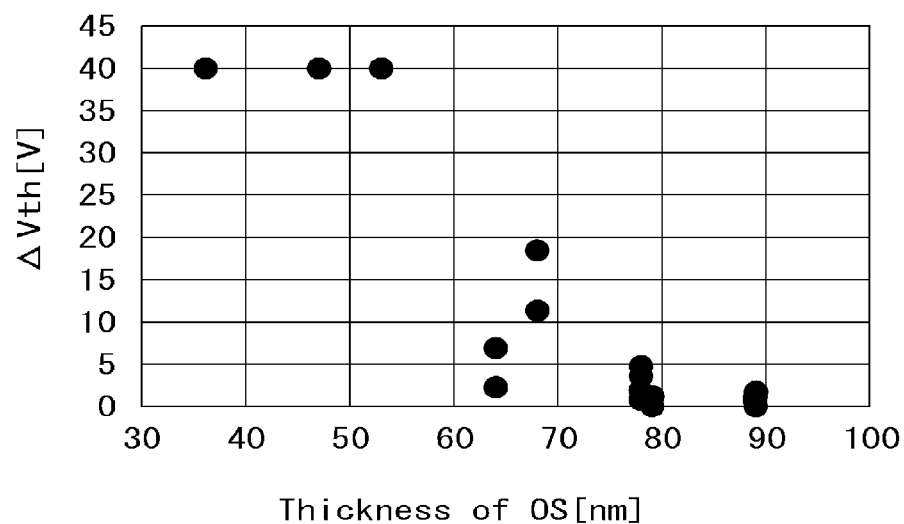
FIG. 6 is a graph showing a relationship between a film thickness of an oxide semiconductor (OS) and a variation Δ Vth of a threshold voltage.

FIG. 6 is a graph showing a relationship between a thickness of an oxide semiconductor and a variation Δ Vth of a threshold voltage. In FIG. 6, the horizontal axis represents the thickness (nm) of the oxide semiconductor (OS) corresponding to FIG. 5, and the vertical axis represents the variation n Vth (V) of the threshold voltage Vth. As shown in FIG. 6, when the thickness of the oxide semiconductor 104 exceeds 55 nm, the variation Δ Vth of the threshold voltage rapidly decreases. When the film thickness becomes 85 nm or more, almost no variation Δ Vth of the threshold voltage is observed.

Incidentally, it can be considered that the variation Δ Vth of the threshold voltage is generated because hot carriers in the LDD region 1041 are accumulated in the gate insulating film 105. Therefore, the effect of the thickness of the oxide semiconductor 104 in FIG. 6 can be considered as an effect of the thickness of the LDD region 1041. On the other hand, when the thickness of the channel region 104 of the oxide semiconductor increases, the OFF current increases. Therefore, the thickness of the oxide semiconductor in the channel region 104 cannot be increased. Preferably, the channel region 104 has a thickness of 60 nm or less.

In this way, in order to suppress the variation Δ Vth of the threshold voltage and suppress an increase in the OFF current, a thickness of the oxide semiconductor is reduced in the channel region 104 and increased in thickness in the LDD region 1041. Specifically, in consideration of OFF current, the thickness t1 of the channel region 104 of the oxide semiconductor is set to 60 nm or less, and the thickness t2 of the LDD region 1041 of the oxide semiconductor is set to 85 nm or more in consideration of variations in the threshold voltage variation Δ Vth. In other words, t2 is preferably greater than or equal to 25 nm greater than t1. Incidentally, the thickness of the channel region 104 is measured at a central portion of the channel region, and the thickness of the LDD region 1041 is measured at a central portion of the LDD region.

Figure 7:
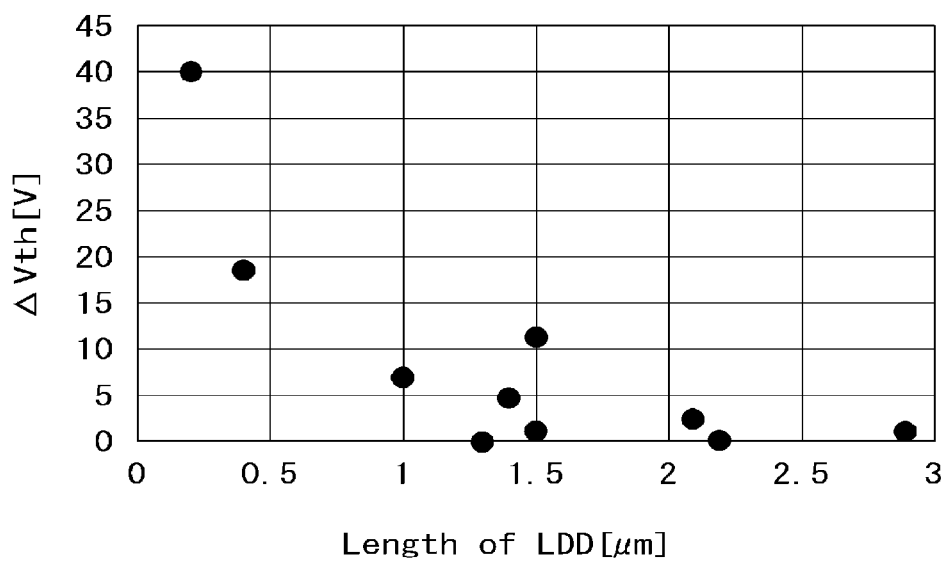
FIG. 7 is a graph showing a relationship between the length of an LDD and a variation Δ Vth of a threshold voltage.

The variation Δ Vth of the threshold voltage is also affected by the length of the LDD region 1041. FIG. 7 is a graph showing the relationship between the length of the LDD region 1041 and the variation Δ Vth of the threshold voltage. In this case, the length of the LDD region 1041 may be defined as a length in the channel length direction. In FIG. 7, the horizontal axis represents the length (μm) of the LDD region 1041, and the vertical axis represents the variation Δ Vth (V) of the threshold voltage. In FIG. 7, the variation Δ Vth of the threshold voltage decreases rapidly when the length of the LDD region 1041 changes from 0 to 1 μm. When the length of the LDD region 1041 becomes 2 μm or more, the variation Δ Vth of the threshold voltage can be suppressed to almost zero.

Figure 8:
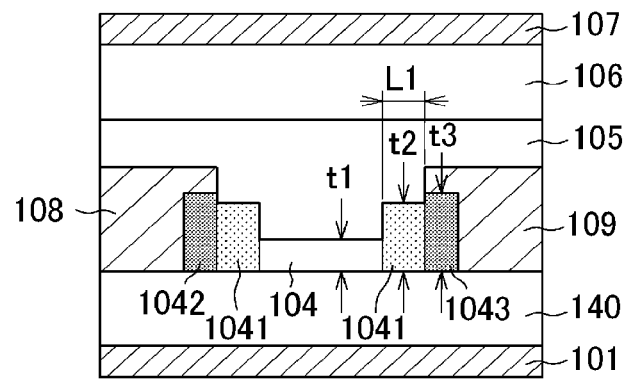
FIG. 8 is a cross-sectional view of an oxide semiconductor TFT according to embodiment 1.

As shown in FIG. 8, for example, the length L1 of the LDD region 1041 in embodiment 1 can be defined as a distance from an end of the drain electrode 109 to a step portion where a film thickness change occurs between the channel region 104 and the LDD region 1041. In other words, by setting the length of the LDD region 1041 to be equal to or larger than 2 μm and making the thickness of the LDD region 1041 larger than that of the channel region, it is possible to effectively suppress the variation Δ Vth of the threshold voltage.

FIG. 8 is a detailed cross-sectional view of an oxide semiconductor TFT according to example 1. In the oxide semiconductor of FIG. 8, a white portion at a center portion is a channel region 104, a portion with thin dots is an LDD region 1401, and a portion with dark dots is a source region 1042 or a drain region 1043. FIG. 8 is different from FIG. 5 in that the thickness of the oxide semiconductor constituting the TFT is different in the channel region 104, the LDD region 1041, and the drain region 1043 (source region 1042) to each other. In other words, in FIG. 8, in order to suppress the variation Δ Vth of the threshold voltage and prevent an increase in OFF current, the thickness of the channel region 104 of the oxide semiconductor is made smaller than the thickness of the LDD region 1041.

Another feature of FIG. 8 is that the thickness t3 of the drain region 1043 (or the source region 1042) of the oxide semiconductor is larger than the thickness t2 of the LDD region 1041 of the oxide semiconductor. This difference is 10 nm or more, preferably 10 to 15 nm. The reason why the thickness t2 of the LDD region 1041 is smaller than the thickness t3 of the drain region 1043 is that the LDD region 1041 is slightly etched when the drain electrode 109 covering the drain region 1043 is etched. In other words, the reason is that the drain electrode 109, which is made of metal, must be removed completely from the LDD region 1041. A specific process for realizing this configuration will be described with reference to FIGS. 11A to 11H.

Figure 9:
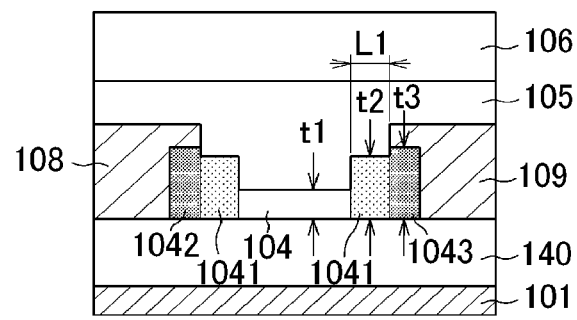
FIG. 9 is a cross-sectional view of another example of an oxide semiconductor TFT according to embodiment 1.
Figure 10:
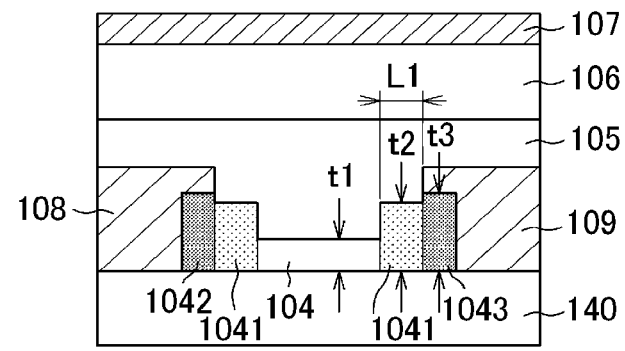
FIG. 10 is a cross-sectional view of yet another example of an oxide semiconductor TFT according to embodiment 1.

FIG. 8 shows a case where the TFT is a so-called dual gate. The present invention is applicable not only to a dual gate type but also to a top gate type or a bottom gate type. FIG. 9 shows a case where the TFT is of the bottom gate type, and FIG. 10 shows a case where the TFT is of the top gate type. FIG. 9 and FIG. 10 are the same as FIG. 8 except for the configuration of the gate electrode.

FIGS. 11A to 11H are cross-sectional views showing a first manufacturing method for realizing a structure in the vicinity of an oxide semiconductor in FIGS. 8, 9, and 10. In each drawing, the oxide semiconductor 104 is formed on the lower gate insulating film 140. A feature of the first manufacturing method is that the oxide semiconductor 104 is formed by 2 processes in order to form an oxide semiconductor having a different film thickness in the channel region 104 and the LDD region 1041.

Figure 11A:
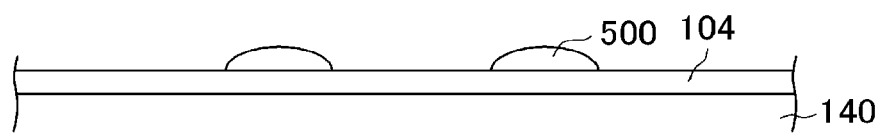
FIG. 11A is a cross sectional view of a first step in the first manufacturing method.
Figure 11B:
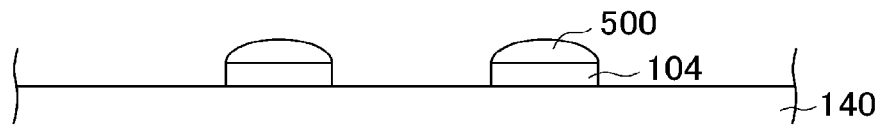
FIG. 11B is a cross sectional view of a second step in the first manufacturing method.

FIG. 11A is a cross-sectional view showing a state in which an oxide semiconductor 104 is entirely deposited on an insulating film 140 and a resist 500 is formed in portions corresponding to the LDD region 1041, the source region 1042, and the drain region 1043 of the oxide semiconductor 104. FIG. 11B is a cross-sectional view showing a state in which the oxide semiconductor 104 is etched using the resist 500.

Figure 11C:
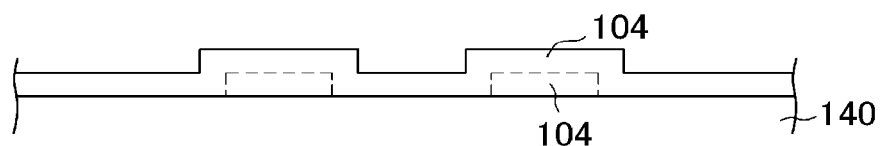
FIG. 11C is a cross sectional view of a third step in the first manufacturing method.
Figure 11D:
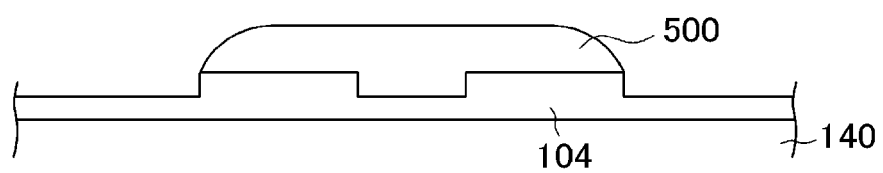
FIG. 11D is a cross sectional view of a fourth step in the first manufacturing method.
Figure 11E:
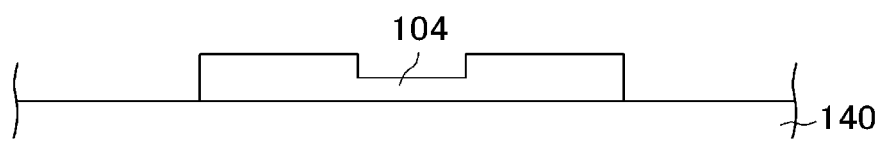
FIG. 11E is a cross sectional view of a fifth step in the first manufacturing method.

FIG. 11C shows a state in which the resist 500 in FIG. 11B is stripped and the oxide semiconductor 104 is deposited on the entire surface again. In FIG. 11C, a portion indicated by a dotted line indicates a range in which the first oxide semiconductor 104 is formed in an island shape as shown in FIG. 11B. FIG. 11D is a cross-sectional view showing a state in which the resist 500 is formed in order to leave only the oxide semiconductor 104 constituting the TFT. FIG. 11E is a cross-sectional view showing a semiconductor 104 having partially different thickness after the semiconductor 104 is etched with the state of FIG. 11D, and then the resist 500 is removed.

Figure 11F:
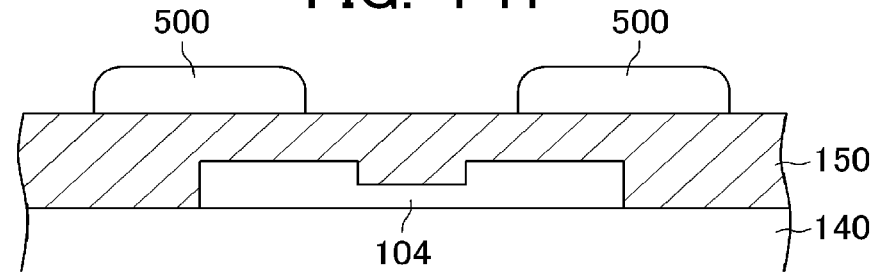
FIG. 11F is a cross sectional view of a sixth step in the first manufacturing method.
Figure 11G:
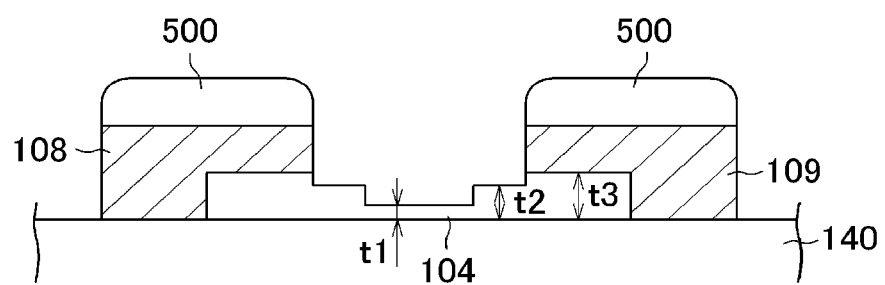
FIG. 11G is a cross sectional view of a seventh step in the first manufacturing method.

FIG. 11F is a cross-sectional view showing a state in which the oxide semiconductor 104 formed in FIG. 11E is covered with a metal film 150 for forming the source electrode 1042 or the drain electrode 1043, and then a resist 500 is patterned to form the source electrode 1042 and the drain electrode 1043. FIG. 11G is a cross-sectional view showing a state in which the metal film 150 is etched using the resist 500 formed in FIG. 11F to form the source electrode 1042 and the drain electrode 1043.

In order to completely remove the metal film 150 from the channel region 104 and the LDD region 1041, it is necessary to etch the channel region 104 and the LDD region 1041 slightly in addition to the etching of the metal film 150. Since the oxide semiconductor 104 can be slightly etched under the condition of etching the metal film 150, the oxide semiconductor 104 can be etched continuously by etching the metal film 150. This process makes a difference in thickness (t3-t2), where t3 is a thickness of the drain region 1043 (source region 1042) of the oxide semiconductor and t2 is a thickness of the LDD region 1041 of the oxide semiconductor.

Figure 11H:
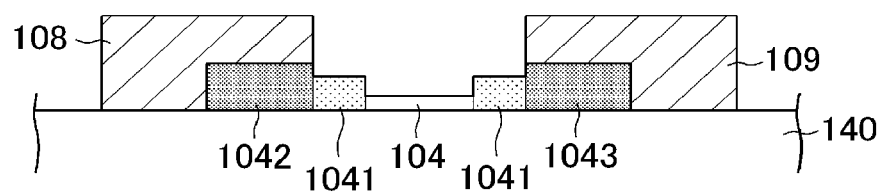
FIG. 11H is a cross sectional view of a eighth step in the first manufacturing method.

FIG. 11H is a cross-sectional view showing a state in which the resist 500 is removed from FIG. 11G. In FIG. 11H, during the time and the subsequent thermal process, oxygen is taken from the drain region 1043 and the source region 1042 of the oxide semiconductor 104 by the drain electrode 109 and the source electrode 108, so that the drain region 1043 and the source region 1042 become conductive. On the other hand, oxygen diffuses from the LDD region 1041 into the drain region 1043 or the source region 1042, and the specific resistance of the LDD region 1041 is larger than that of the drain region 1043 (the source region 1042) and smaller than that of the channel region 104.

FIGS. 12A to 12H are cross-sectional views illustrating a second manufacturing method for realizing a structure in the vicinity of an oxide semiconductor shown in FIGS. 8, 9, and 10. In each drawing, the oxide semiconductor 104 is formed on the lower gate insulating film 140. A feature of the second manufacturing method is that the oxide semiconductor 104 having a difference in thickness is formed using a half etching technique in order to form an oxide semiconductor having a different film thickness in the channel region 104 and the LDD region 1041.

Figure 12A:
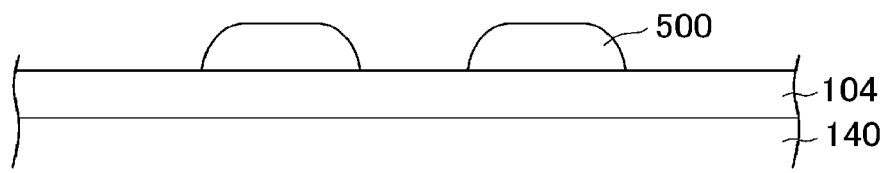
FIG. 12A is a cross sectional view of a first step in the second manufacturing method.
Figure 12B:
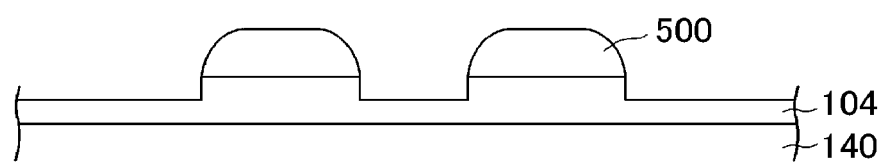
FIG. 12B is a cross sectional view of a second step in the second manufacturing method.
Figure 12C:
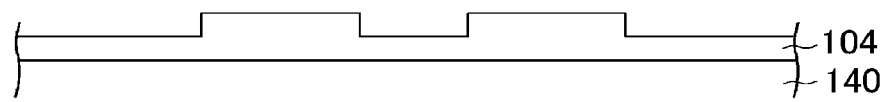
FIG. 12C is a cross sectional view of a third step in the second manufacturing method.

FIG. 12A is a cross-sectional view showing a state in which an oxide semiconductor 104 having the same thickness as that of the drain region 1043 (the source region 1042) is deposited over the entire surface of the insulating film 140, and a resist 500 is formed in a portion corresponding to the LDD region 1041, the drain region 1043, and the source region 1042. FIG. 12B is a cross-sectional view showing a state in which the oxide semiconductor 104 is etched using the resist 500 so that a thickness difference of the drain region 1043 (the source region 1042) and the channel region 104 is generated. FIG. 12C is a cross-sectional view showing a state in which the resist 500 is removed from the state of FIG. 12B.

Figure 12D:
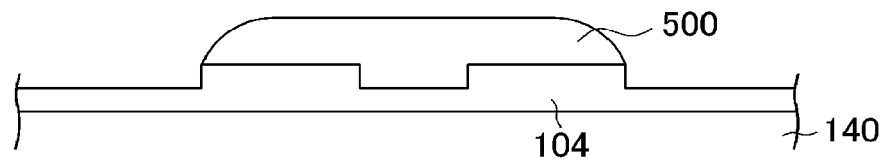
FIG. 12D is a cross sectional view of a fourth step in the second manufacturing method.
Figure 12E:
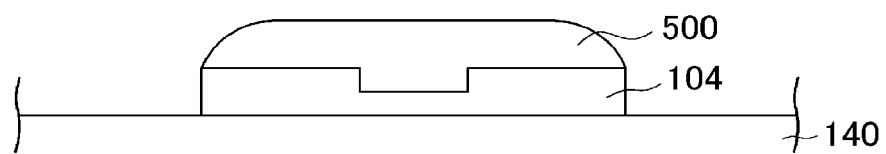
FIG. 12E is a cross sectional view of a fifth step in the second manufacturing method.

FIG. 12D is a cross-sectional view showing a state in which the resist 500 is formed so as to leave only the oxide semiconductor 104 constituting the TFT. FIG. 12E is a cross-sectional view showing a state in which only the oxide semiconductor 104 constituting the TFT is left using the resist 500 and the other oxide semiconductor 104 is removed. Thus, the oxide semiconductor 104 having a difference in thickness is formed.

Figure 12F:
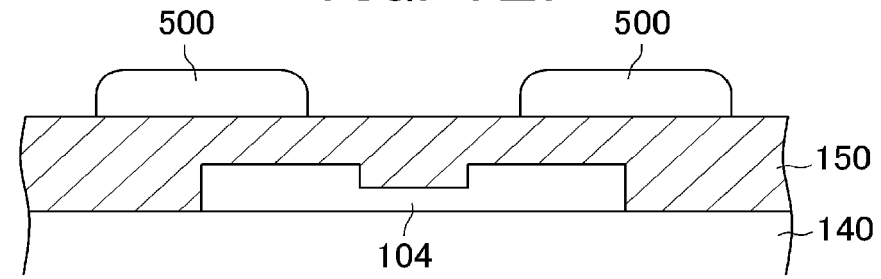
FIG. 12F is a cross sectional view of a sixth step in the second manufacturing method.
Figure 12G:
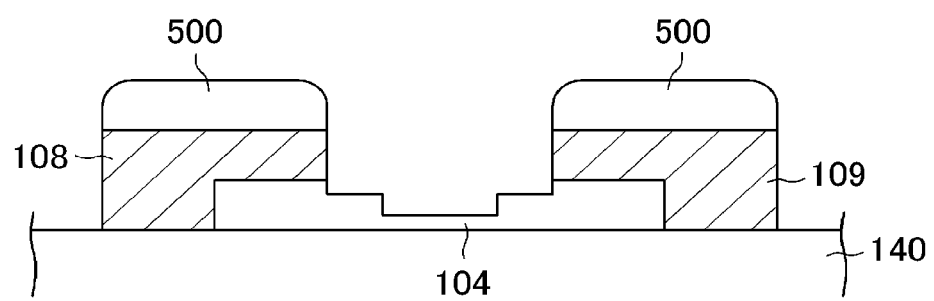
FIG. 12G is a cross sectional view of a seventh step in the second manufacturing method.
Figure 12H:
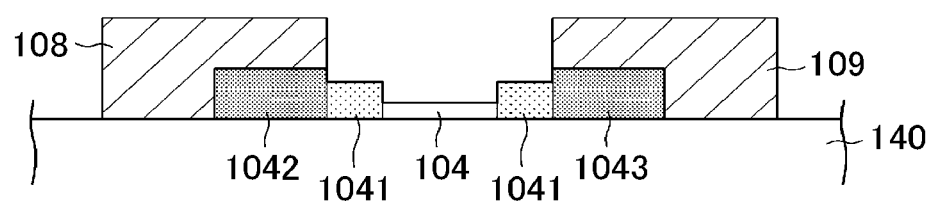
FIG. 12H is a cross sectional view of a eighth step in the second manufacturing method.

Thereafter, as shown in FIG. 12F, 12G, and FIG. 12H, a drain electrode 109 and a source electrode 108 are formed by metal, and a channel region 104, an LDD region 1041, a drain region 1043, and a source region 1042 are formed in an oxide semiconductor. Since the processes shown in FIG. 12F, FIG. 12G, and FIG. 12H are the same as processes shown FIG. 11F, FIG. 11G, and FIG. 11H, a description is omitted.

FIGS. 13A to 13F are cross-sectional views illustrating a third manufacturing method for realizing a structure near an oxide semiconductor shown in FIGS. 8, 9, and 10. In each drawing, the oxide semiconductor 104 is formed on the lower gate insulating film 140. A feature of the third manufacturing method is that, in order to form an oxide semiconductor having a different film thickness in the channel region 104, the LDD region 1041, the source region 1042, and the drain region 1043, a technique is used in which the resist 500 is retreated when the drain electrode 109 and the source electrode 108 are formed, thereby etching the oxide semiconductor.

Figure 13A:
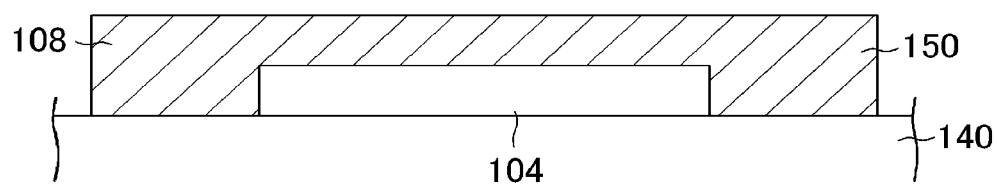
FIG. 13A is a cross sectional view of a first step in the third manufacturing method.

FIG. 13A is a cross-sectional view showing a state in which a metal film 150 for forming the source electrode 108 and the drain electrode 109 is deposited after patterning the oxide semiconductor 104. The thickness of the oxide semiconductor 104 in this state is equal to the thickness of the source region 1042 and the drain region 1043 in the final TFT.

Figure 13B:
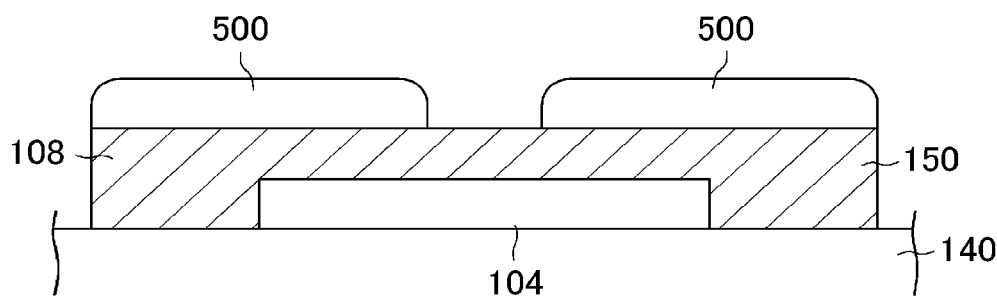
FIG. 13B is a cross sectional view of a second step in the third manufacturing method.
Figure 13C:
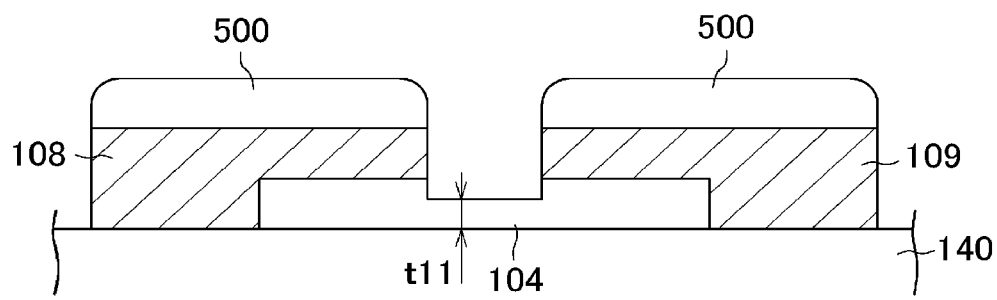
FIG. 13C is a cross sectional view of a third step in the third manufacturing method.

FIG. 13B is a cross-sectional view showing a state in which patterning of the resist 500 for forming the channel region 104 by etching the oxide semiconductor 104 is performed together with patterning of the source electrode 108 and the drain electrode 109. FIG. 13C shows a state in which the source electrode 108 and the drain electrode 109 are formed by etching the metal using the resist 500, and a part of the oxide semiconductor 104 is etched to form a channel region in the oxide semiconductor 104 in the same process. The thickness t11 of the channel region 104 of the oxide semiconductor in FIG. 13C is larger than the final thickness t1. This is because the channel region 104 is etched again in a later step.

Figure 13D:
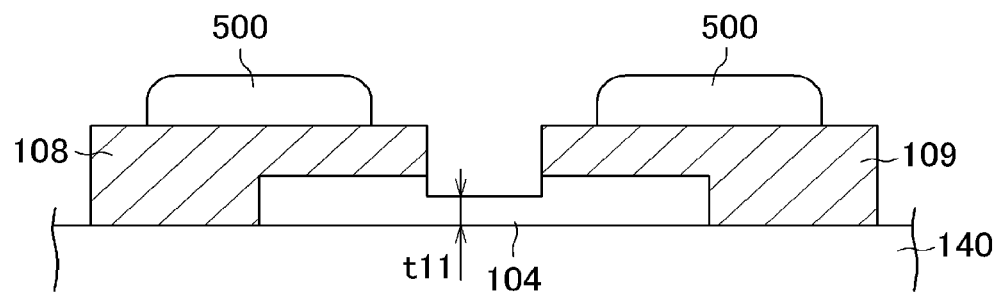
FIG. 13D is a cross sectional view of a fourth step in the third manufacturing method.

FIG. 13D is a cross-sectional view showing a state in which the resist 500 is retreated using an oxygen plasma or the like for the resist 500 in the state of FIG. 13C. After the resist 500 is retreated by the oxygen plasma, a portion of the source electrode 108 and the drain electrode 109 and a channel region 104 of the oxide semiconductor are exposed.

Figure 13E:
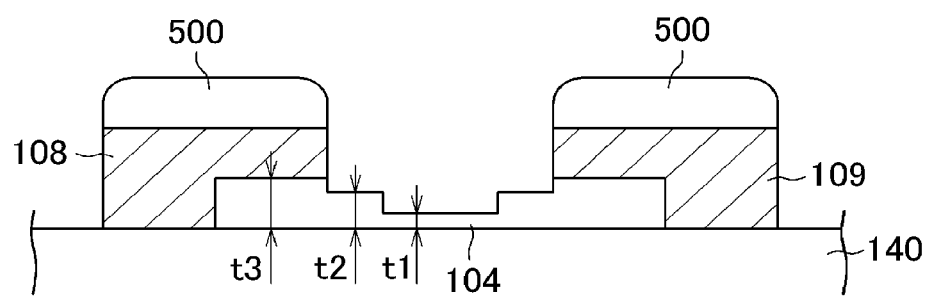
FIG. 13E is a cross sectional view of a fifth step in the third manufacturing method.

FIG. 13E is a cross-sectional view showing a state in which the source electrode 1042, the drain electrode 1043, and the oxide semiconductor 104 are etched using the retreated resist 500. In this etching, the channel region 104 of the oxide semiconductor is etched to a final thickness t1. Further, after the source electrode 108 and the drain electrode 109 are etched, the oxide semiconductor corresponding to the LDD region 1041 is slightly etched in order to reliably form the LDD region 1041 in the oxide semiconductor. Accordingly, in the oxide semiconductor, the thickness t2 corresponding to the LDD region 1041 is smaller than the thickness t3 corresponding to the source region 1042 and the drain region 1043. Thus, the final shapes of the oxide semiconductor 104, the drain electrode 108, and the source electrode 109 are determined.

Figure 13F:
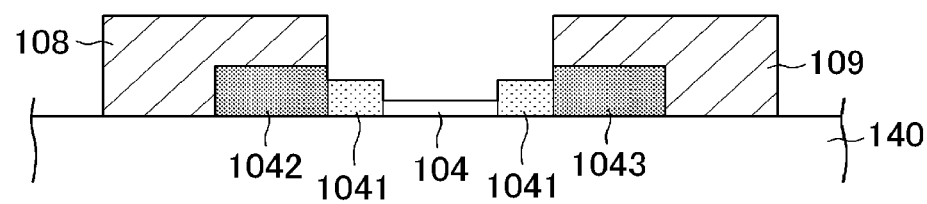
FIG. 13F is a cross sectional view of a sixth step in the third manufacturing method.

FIG. 13F shows a state in which the resist 500 in FIG. 13E is removed. In this state, since the drain region 1042 and the source region 1043 of the oxide semiconductor are deprived of oxygen by the source electrode 108 and the drain electrode 109 which are metal, they become conductive. In addition, in the LDD region 1041, since oxygen diffuses into the source region 1042 or the drain region 1043, the resistivity becomes smaller than that of the channel region 104. However, the resistivity of the LDD region 1041 is larger than that of the source region 1042 and the drain region 1043.

As described above, according to the configuration of embodiment 1, in the TFT including an oxide semiconductor, the LDD region 1041 can be reliably formed, and the variation Δ Vth of the threshold voltage can be suppressed. Further, it is also possible to suppress an increase in OFF current.

Embodiment 2

FIG. 14A and FIG. 14B are cross-sectional views showing a first example of embodiment 2. FIG. 14A is an enlarged cross-sectional view of the vicinity of the TFT. In FIG. 14A, the oxide semiconductor is the same as in FIG. 8 of embodiment 1 until the first upper gate insulating film 105 is formed, except that the channel region 104, the drain region 1043 and the source region 1042 have the same thickness. In FIG. 14A, a through hole 200 is formed in a second upper gate insulating film 106 corresponding to a region where an LDD region 1041 is formed in an oxide semiconductor 104.

FIG. 14B is a cross-sectional view showing a state in which the upper gate electrode 107 is formed so as to cover the second upper gate insulating film 106 and the through hole 200. In FIG. 14B, a metal gate electrode 107 is also present in the through hole 200 formed in the second upper gate insulating film 106. Therefore, oxygen is removed from the oxide semiconductor 104 by the gate electrode 107 in the through hole 200. Then, this portion has a smaller resistivity than that of the channel region 104. However, this portion has a higher resistivity than the source and drain regions 1042 and 1043 in contact with the metal. In other words, it can act as the LDD region 1041. A feature of this embodiment is that the range of the LDD region 1041 of the oxide semiconductor can be defined by the through hole 200 formed in the second upper gate insulating film 106.

FIGS. 15A and 15B are cross-sectional views showing a second example of the embodiment 2. This configuration is a combination of the structure of example 1 of embodiment 2 and the structure of embodiment 1. FIG. 15A differs from FIG. 14A in that the oxide semiconductor has a different thickness in the channel region 104, the LDD region 1041, the source region 1042, and the drain region 1043. Such an oxide semiconductor can be formed by any of the first to third 3 examples described in embodiment 1.

FIG. 15B is a cross-sectional view showing a state in which the upper gate electrode 107 is formed so as to cover the second upper gate insulating film 106 and the through hole 200. As shown in FIG. 15B, the LDD region 1041 is configured to be deprived of oxygen by the upper gate electrode 107, and in addition, since the film thickness of the channel region 104 is smaller than that of the LDD region 1041, both the suppression of the threshold voltage variation Δ Vth and the reduction of the leakage current can be more effectively performed. In other words, embodiment 2 can combine the effect of embodiment 1 with the effect of example 1 of embodiment 2.

Embodiment 3

In embodiment 3, the LDD region 1041 is formed by ion implantation. FIG. 16A and FIG. 16B are cross-sectional views showing a first example of the embodiment 3. In FIG. 16A, after the oxide semiconductor is patterned, a resist is formed on the channel region 104, and, for example, boron (B) is doped into regions corresponding to the LDD region 1041, the source region 1042, and the drain region 1043 by ion implantation.

Thereafter, a source electrode 108, a drain electrode 109, a first upper gate insulating film 105, a second upper gate insulating film 106, and a gate electrode 107 are formed. FIG. 16B is a cross-sectional view showing this state. FIG. 16B is similar in shape to FIG. 5 except that the LDD region 1041 is formed by ion implantation. In other words, even when the thickness of the oxide semiconductor 104 is reduced so as to suppress OFF current, since the resistivity of the LDD region can be controlled by the amount of ion implanted by ion implantation, an increase in the variation Δ Vth of the threshold voltage can be suppressed.

FIG. 17A and FIG. 17B are cross-sectional views showing a second example of the embodiment 3. In FIG. 17A, after the oxide semiconductor is patterned, a resist 500 is formed on the channel region 104, and, for example, boron (B) is doped into regions corresponding to the LDD region 1041, the source region 1042, and the drain region 1043 by ion implantation. The configuration of FIG. 17A is similar to that of FIG. 16A, but the thickness of the oxide semiconductor is different. Although the thickness of the oxide semiconductor 104 in FIG. 16A is equal to the thickness t1 of the channel region 104, the thickness of the oxide semiconductor 104 in FIG. 17A is equal to the thickness t3 of the source region 1042 or the drain region 1043.

Thereafter, a drain electrode 109, a source electrode 108, and an oxide semiconductor (104, 1041, 1042, 1043) having a difference in thickness are formed by, e.g., a process as described in the third example of embodiment 1. Thereafter, a first upper gate insulating film 105, a second upper gate insulating film 106, and an upper gate electrode 107 are formed. FIG. 17B is a cross-sectional view showing this state.

FIG. 17B is similar in shape to FIG. 8 except that the LDD region 1041 is formed by ion implantation. On the other hand, by providing a difference in film thickness between the channel region 104, the LDD region 1041, and the drain region 1043 (source region 1042), the effect described in embodiment 1 can be obtained. Thus, example 2 can combine the effect of embodiment 1 with the effect described in example 1 of embodiment 3.

What is claimed is:

1. A semiconductor device having TFT using an oxide semiconductor comprising:
   the oxide semiconductor including a channel region, a source region, a drain region, and a transition region between the channel region and the source region and between the channel region and the drain region, wherein
   a resistivity of the transition region is smaller than that of the channel region, and larger than that of the source region or the drain region,
   a source electrode is formed overlapping the source region, and a drain electrode is formed overlapping the drain region,
   a thickness of the transition region of the oxide semiconductor is larger than a thickness of the channel region of the oxide semiconductor,
   a first gate insulating film covers the oxide semiconductor,
   a second gate insulating film covers the first gate insulating film,
   a through hole is formed in the second gate insulating film at a place corresponding to the transition region of the oxide semiconductor, and
   a gate electrode is formed covering the second gate insulating film and the through hole.

2. The semiconductor device according to claim 1, wherein, in the oxide semiconductor, a thickness of the source region or a thickness of the drain region is larger than a thickness of the transition region.

3. The semiconductor device according to claim 1, wherein, in the oxide semiconductor, a thickness of the channel region is 60 nm or less when measured at a center of the channel region, and a thickness of the transition region measured at a center of the transition region is 85 nm or more.

4. The semiconductor device according to claim 2, wherein, in the oxide semiconductor, a thickness of the channel region is 60 nm or less when measured at a center of the channel region, and a thickness of the transition region measured at a center of the transition region is 85 nm or more.

5. The semiconductor device according to claim 2, wherein a difference in thickness between the source region and the transition region or a difference in thickness between the drain region and the transition region is 10 nm or more.

6. The semiconductor device according to claim 1, wherein a length of the transition region in a direction of a channel length is 2 microns or more.

7. The semiconductor device according to claim 2, wherein a length of the transition region in a direction of channel length is 2 microns or more.

8. The semiconductor device according to claim 3, wherein a length of the transition region in a direction of channel length is 2 microns or more.

9. The semiconductor device according to claim 1, wherein the TFT is a bottom gate type TFT.

10. The semiconductor device according to claim 1, wherein the TFT is a dual gate type TFT which has a bottom gate and a top gate.

11. The semiconductor device according to claim 1, wherein ions are doped in the transition region to raise a conductivity of the oxide semiconductor.

12. A semiconductor device having TFT using an oxide semiconductor comprising:
- the oxide semiconductor including a channel region, a source region, a drain region, and a transition region between the channel region and the source region and between the channel region and the drain region, wherein
- a resistivity of the transition region is smaller than that of the channel region, and larger than that of the source region or the drain region,
- a source electrode is formed overlapping the source region, and a drain electrode is formed overlapping the drain region,
- a first gate insulating film is formed covering the oxide semiconductor,
- a second gate insulating film is formed covering the first gate insulating film,
- a through hole is formed in the second gate insulating film at a place corresponding the transition region of the oxide semiconductor, and
- a gate electrode is formed covering the second insulating film and the through hole.

13. The semiconductor device according to claim 12, wherein a thickness of the transition region is 60 nm or less.

14. The semiconductor device according to claim 12, wherein a length of the transition region in a direction of a channel length is 2 microns or more.

15. The semiconductor device according to claim 12, wherein a third gate insulating film is formed under the oxide semiconductor, and
a second gate electrode is formed under the third gate insulating film.

* * * * *